United States Patent

Shiozaki et al.

[11] Patent Number: 5,998,730
[45] Date of Patent: Dec. 7, 1999

[54] PRODUCTION METHOD FOR DEPOSITED FILM, PRODUCTION METHOD FOR PHOTOELECTRIC CONVERSION ELEMENT, PRODUCTION APPARATUS FOR DEPOSITED FILM, PRODUCTION APPARATUS FOR PHOTOELECTRIC CONVERSION ELEMENT

[75] Inventors: Atsushi Shiozaki, Sohraku-gun; Koichi Matsuda, Kyotanabe, both of Japan

[73] Assignee: Canon Kabushiki Kaisha, Tokyo, Japan

[21] Appl. No.: 09/076,237

[22] Filed: May 12, 1998

[30] Foreign Application Priority Data

May 13, 1997 [JP] Japan ................................. 9-122184
Jul. 16, 1997 [JP] Japan ................................. 9-205509

[51] Int. Cl.$^6$ ................................................ H01L 31/18
[52] U.S. Cl. ................... 136/256; 136/259; 204/192.29; 204/192.27; 204/298.02; 438/72
[58] Field of Search ..................... 136/256, 259; 204/192.27, 192.29, 298.02; 438/72

[56] References Cited

U.S. PATENT DOCUMENTS 4,419,533 12/1983 Czubatyj et al. ...................... 136/259
4,532,372 7/1985 Nath et al. ............................. 136/256
5,500,055 3/1996 Toyama et al. ....................... 136/259
5,612,229 3/1997 Yoshida ................................ 136/256

FOREIGN PATENT DOCUMENTS 62-211377  9/1987  Japan .
2297737   12/1990  Japan .
5171434    7/1993  Japan .
6116722    4/1994  Japan .
6116723    4/1994  Japan .

*Primary Examiner*—Mark Chapman
*Attorney, Agent, or Firm*—Fitzpatrick, Cella, Harper & Scinto

[57] ABSTRACT

The present invention is to provide a production method for a deposit film comprising: a step of forming a reflecting layer on a substrate by opening a film forming chamber to the atmosphere, reducing the pressure of the film forming chamber, heating the film forming chamber to a temperature higher than a predetermined film forming temperature followed by cooling or self-cooling, and setting the film forming chamber at the predetermined film forming temperature, a step of contacting the reflecting layer surface with active oxygen and/or oxygen ion, and a step of forming a transparent conductive layer. According to the present invention, highly reliable reflecting layer and transparent conductive layer having a high reflectance can be stably obtained with a desired texture structure at a low cost.

56 Claims, 4 Drawing Sheets

PRODUCTION METHOD FOR DEPOSITED FILM, PRODUCTION METHOD FOR PHOTOELECTRIC CONVERSION ELEMENT, PRODUCTION APPARATUS FOR DEPOSITED FILM, PRODUCTION APPARATUS FOR PHOTOELECTRIC CONVERSION ELEMENT

FIELD OF THE INVENTION AND RELATED ART

The present invention relates to a production method for a deposited film, a production apparatus for a deposited film, a production method for a photoelectric conversion element, and a production apparatus for a photoelectric conversion element. More specifically, it relates to a method for forming a reflecting layer for effectively utilizing a light beam incident on a photoelectric conversion element so as to improve the photoelectric conversion efficiency, and a transparent conductive layer formed on the reflecting layer, and a production method for a photoelectric conversion element utilizing the reflective layer and conductive layer.

Photoelectric conversion elements have been used as an independent power source (photoelectromotive force) for various kinds of electric appliances. Photoelectric conversion elements such as a solar battery utilizing the solar power as the energy source substituting for system power have also been used. Research and development are actively conducted thereon.

For example, the photoelectric conversion parts themselves, such as crystalline photoelectric conversion elements comprising a single crystalline or polycrystalline silicon having a high conversion efficiency, and so-called thin film photoelectric conversion elements using a compound semiconductor including amorphous silicon (hereinafter referred to as a-Si) and $CdS.CuInSe_2$ to be provided at a low cost have been actively studied and developed. Further, technology for effectively utilizing a radiated light beam, a technology for preventing diffusion of an electrode material to a photoelectric conversion part, and a technology for efficiently taking out converted electric energy to the outside have been studied and developed.

Examples of technologies effectively utilizing a radiated light beam include a technology for a light scattering layer (transparent conductive layer) for prolonging the optical path length in a photoelectric conversion part by scattering an incident light beam, and a technology for a reflecting layer for reflecting a light beam not absorbed at a photoelectric conversion part to the photoelectric conversion part to be reused. As a technology for preventing the scatter of an electrode material to a photoelectric conversion part, a technology of providing a barrier layer between a reflecting layer and the photoelectric conversion part can be presented. Further, as a technology for efficiently taking out converted electric energy to the outside, a technology of providing a resistive layer for preventing waste of electric energy at the defect part caused by generation of short-circuit by a defect of a photoelectric conversion element is known. It is known that the optical path length of a reflected light beam can be prolonged by providing a rugged structure (textured structure) on the surface of a reflecting layer and/or a transparent conductive layer.

U.S. Pat. No. 4,419,533 discloses providing a barrier layer made from zinc oxide for preventing diffusion of a reflecting layer to a photoelectric conversion element. Further, U.S. Pat. No. 4,532,372 discloses preventing generation of short-circuit caused by a defect in a semiconductor layer by forming a transparent conductive layer on a reflecting layer. U.S. Pat. No. 5,500,055 discloses providing a rugged textured structure on a transparent resistive layer, which also serves as a barrier layer on a reflecting layer.

It is known that aluminum can be used as a reflecting layer. Japanese Patent Laid-Open No. 62-211377 discloses a method of producing an aluminum film by sputtering while supplying an oxygen gas with the amount monitored by a quadrupole mass spectrometer so as to control the oxygen gas flow rate. Is mentions that the particle size of the aluminum can be controlled thereby.

Japanese Patent Laid-Open No. 2-297737 discloses a method of sputtering an aluminum film where corrosion and deformation defects are prevented by maintaining an inert gas pressure at 10 mtorr or more. Japanese Patent Laid-Open No. 5-171434 discloses a method of forming an aluminum film without projections by sputtering an aluminum film with air in a vacuum container.

Japanese Patent Laid-Open No. 6-116723 discloses a method for obtaining a smooth aluminum film by repeating a step of producing aluminum by sputtering and a step of exposing the aluminum film to a gas mixture of nitrogen and oxygen.

Japanese Patent Laid-Open No. 6-116722 discloses a method of continuously forming a metal layer and a transparent conductive layer by a sputtering method on a longitudinal substrate while moving the substrate (roll to roll method).

However, it was revealed that a photoelectric conversion element having an aluminum reflecting layer and a transparent conductive layer laminated thereon involves the following problems.

Aluminum production at a high temperature contributes to improvement of adhesion and crystallization so as to form ruggedness. However, on the other hand, it was learned that the grain boundary of the aluminum absorbs a light beam to lower the reflectance, resulting in reduction of the amount of light to be converted at a semiconductor layer. Moreover, it was revealed that the reflectance is lowered in the continuous production of a reflecting layer and a transparent conductive layer with a roll to roll method apparatus.

A structure for adhering a film in a vacuum apparatus and target material need to have a regular maintenance so the inside of the apparatus is exposed to an atmospheric state. In film formation after exposure to the atmosphere, the conversion efficiency of a photoelectric conversion element sometimes was not stable. In particular, in the roll to roll method, since a film is formed while transporting a longitudinal substrate in a plurality of interlocked film forming chambers, a long time is required in the film formation. In this case, the above-mentioned instability of the conversion efficiency was conspicuous. For example, by having a preliminary heating for 12 hours with the temperature condition the same as that of the film formation, starting the film formation, and producing a metal layer with the apparatus after 10 hours, the conversion efficiency of a photoelectromotive force element having the metal layer can be lower than one having the highest efficiency by 4%.

When the evacuation is conducted in the width direction of the substrate, the conversion efficiency may have a large distribution in the width direction. Although the cause is not known, it can be considered that the conduction state in the transparent conductive layer varies by the effect of a residual impurity gas in the film and the like, so as to affect the semiconductor junction.

For the reflecting layer, gold, silver, or copper can be used instead of aluminum. However, problems are involved in that use of gold or silver for the reflecting layer will raise the cost, and use of silver or copper generates short-circuits through a semiconductor layer by being partially electrically ionized by the existence of a slight amount of water.

By combining a reflecting layer, a transparent conductive layer, and a photoelectric conversion part (semiconductor layer, etc.), remarkable improvement of the conversion efficiency of the photoelectric conversion element can be expected to bring about cost reduction of the electric energy to be obtained. However, according to knowledge of the present inventors, the effect is not as much as expected, and the cost of the electric energy obtained is not sufficiently low. In addition to the high conversion efficiency, a long term reliability for 10 to 20 years is not sufficiently proved. Therefore, the photoelectric conversion element has not been commonly used yet for electrical system power as yet.

In view of the contents of the above-mentioned U.S. Patents, the present inventors considered that a configuration where a reflecting layer is formed on a substrate for reflecting a light beam not absorbed by a photoelectric conversion part to the photoelectric conversion part to be reused, and a transparent conductive layer (the layer is also referred to as a transparent resistive layer since it is preferable that the layer has a certain degree of resistance), which also serves as a barrier layer for preventing diffusion of a material of the reflecting layer to the photoelectric conversion part, for preventing short-circuits caused by a defect of a semiconductor layer formed thereon, is most suitable. As a result, the following problems are pointed out.

First, gold and silver used for a reflecting layer in the prior arts are expensive.

Second, when silver or copper is used, short-circuits are generated through a semiconductor layer to prevent power from being taken out. The problem is likely to occur especially when it is humid and a light beam is radiated only on a part of a photoelectric conversion element for a long time. As a result of the discussion of the present inventors, it was learned that the potential with the reversed polarity with respect to the potential to be generated in the ordinary photoelectric conversion is applied on the part of the photoelectric conversion element when a light beam is irradiated only on a part of a photoelectric conversion element so that a semiconductor layer can be short-circuited by the ionization of a metal element of the reflecting layer after a long time use by the interaction of the reversed potential and moisture, which cannot be shut out by an inexpensive resin protection. Further, it was also learned that the problem is not generated with aluminum or gold. It was further learned that the short-circuit of the semiconductor layer can be prevented by sufficiently blocking the moisture by providing a protection film such as a vitreous material, however, it is difficult to produce a lightweight and flexible photoelectric conversion element at a low cost by this method.

A third problem is generated when an aluminum film, which does not cause the short-circuit phenomenon of the second problem, is used for a reflecting layer. That is, by laminating a transparent resistive layer for preventing the short-circuit among electrodes by a defect of a semiconductor layer after forming an aluminum film on a substrate as a reflecting layer, the reflectance is lowered. As disclosed in U.S. Pat. No. 4,419,533, the reflectance can be lowered by producing an aluminum film for the reflecting layer at a high temperature or having a thicker layer so as to produce ruggedness for scattering a light beam to effectively utilize the light beam. Although the crystallization of the aluminum can be improved by producing the aluminum film at a high temperature or having a thicker layer so as to produce the ruggedness by the crystal grains, however it was learned that the grain boundary of the aluminum absorbs the light beam to lower the reflectance so that the amount of light to be electrically converted is lowered in the semiconductor layer in the method. Further, as disclosed in U.S. Pat. No. 5,500,055, in producing a textured structure in a transparent resistive layer, by continuously producing a reflecting layer and a transparent conductive layer with a roll to roll method apparatus as shown in FIG. 2 later described, as a particularly cost effective production method, the reflectance is also lowered. It can be attributed to the energy generated at the time of depositing the transparent conductive layer on the reflecting layer, which accelerates the crystallization of the aluminum film to develop the grain boundary so that the grain boundary absorbs the light beam to lower the reflectance.

As heretofore mentioned, it was difficult to obtain the reflecting layer and transparent resistive layer having a high reflectance and a high reliability with a desired texture structure at a low cost.

SUMMARY OF THE INVENTION

The present invention has been made as a result of the elaborate study for solving the above-mentioned problems. Accordingly, an object of the present invention is to provide a method and an apparatus for forming the reflecting layer and the transparent conductive layer in a state where the conversion efficiency from the light beam to electricity by effectively utilizing an incident light beam in a deposited film comprising a reflecting layer and a transparent conductive layer successively laminated on a substrate, and a photoelectric conversion element using the same.

The present invention is to provide a production method for a deposited film where a reflecting layer and a transparent conductive layer are successively laminated on a substrate, wherein the reflecting layer is contacted with active oxygen and/or oxygen ion after the reflecting layer formation on the substrate, and then the transparent conductive layer is formed.

Further, the present invention is to provide a production method for a deposit film comprising a step of forming a reflecting layer on a substrate by reducing the pressure in a film forming chamber after opening the film forming chamber to the atmosphere, heating the film forming chamber to a temperature higher than a certain film forming temperature followed by cooling or self-cooling, and setting the film forming chamber at the certain film forming temperature, a step of contacting the reflecting layer surface with active oxygen and/or oxygen ion, and a step of forming a transparent conductive layer. Moreover, the present invention is to provide a production method for a photoelectric conversion element where a semiconductor is formed after forming a metal layer and a transparent conductive layer with the above-mentioned method.

It is preferable in the above-mentioned method of the present invention that a step of forming a layer made from aluminum or a material containing aluminum as the reflecting layer on the substrate by sputtering, a step of contacting the formed layer with oxygen ion, and a step of forming a layer mainly containing zinc oxide on the layer as the transparent conductive layer by sputtering are conducted continuously in serial spaces in successively laminating a reflecting layer and a transparent conductive layer on a substrate, wherein the oxygen gas amount introduced from the space for the oxygen gas contact to the space for the film formation of the reflecting layer is limited at 10% or less with respect to the gas partial pressure.

An apparatus preferably used in the present invention comprises a means for forming a reflecting layer made from aluminum or a material containing aluminum on a substrate by sputtering, a means for conducting glow discharge in an atmosphere containing an oxygen gas with either or both of a target mainly including aluminum or a material containing aluminum and a target mainly including zinc oxide provided as a cathode electrode, a means for passing the formed reflecting layer through the glow means, a means for limiting the introduction of an oxygen gas to the reflecting layer forming means while allowing the passage of the substrate, provided between the reflecting layer forming means and the glow discharge conducting means, and a means for forming a transparent conductive layer mainly including zinc oxide by sputtering.

In a photoelectric conversion element having a reflecting layer and a transparent resistive layer formed according to the present invention, an incident light beam can be used efficiently and effectively even in continuous use over a long term so as to perform a stable and high photoelectric conversion efficiency. The photoelectric conversion element can be used for a system power. Further, the photoelectric conversion element can be produced at a low cost.

DESCRIPTION OF PREFERRED EMBODIMENTS

Hereinafter the present invention will be explained with reference to embodiments, but the present invention is not limited thereto.

Figure 1:
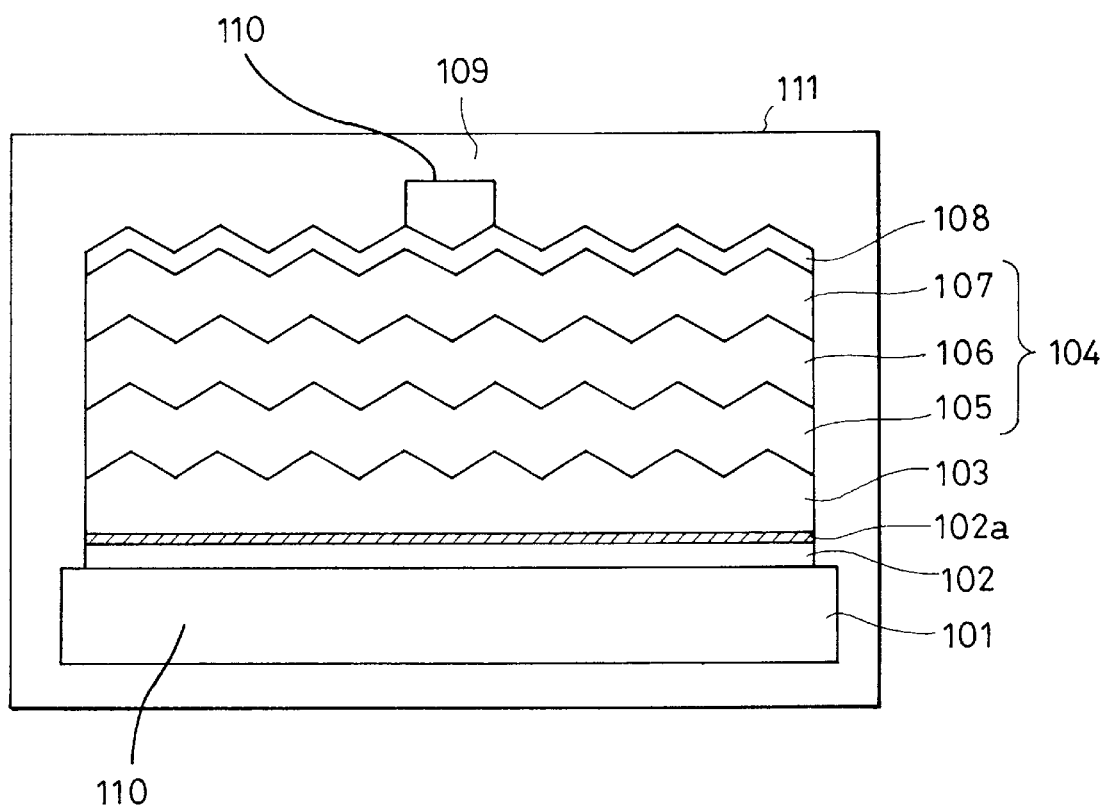
FIG. 1 is a schematic cross-sectional diagram showing an embodiment of a photoelectric conversion element of the present invention.

FIG. 1 is a schematic cross-sectional diagram of an embodiment of a photoelectric conversion element of the present invention. In FIG. 1, numeral 101 represents a substrate, 102 a reflecting layer, 102a a surface region treated with oxygen ion and/or active oxygen of the reflecting layer, 103 a transparent conductive layer, 104 a semiconductor layer (photoelectric conversion part) having a semiconductor junction (pin junction), 105 an n type amorphous silicon (a-Si) layer, 106 an i type amorphous silicon (a-Si) layer, 107 a p type amorphous silicon (a-Si) or crystalline silicon ($\mu$c-Si) layer, 108 a reflection preventing layer, which also serves as a transparent electrode, 109 a collecting electrode, 110 an output terminal, and 111 a protecting resin.

Figure 2A:
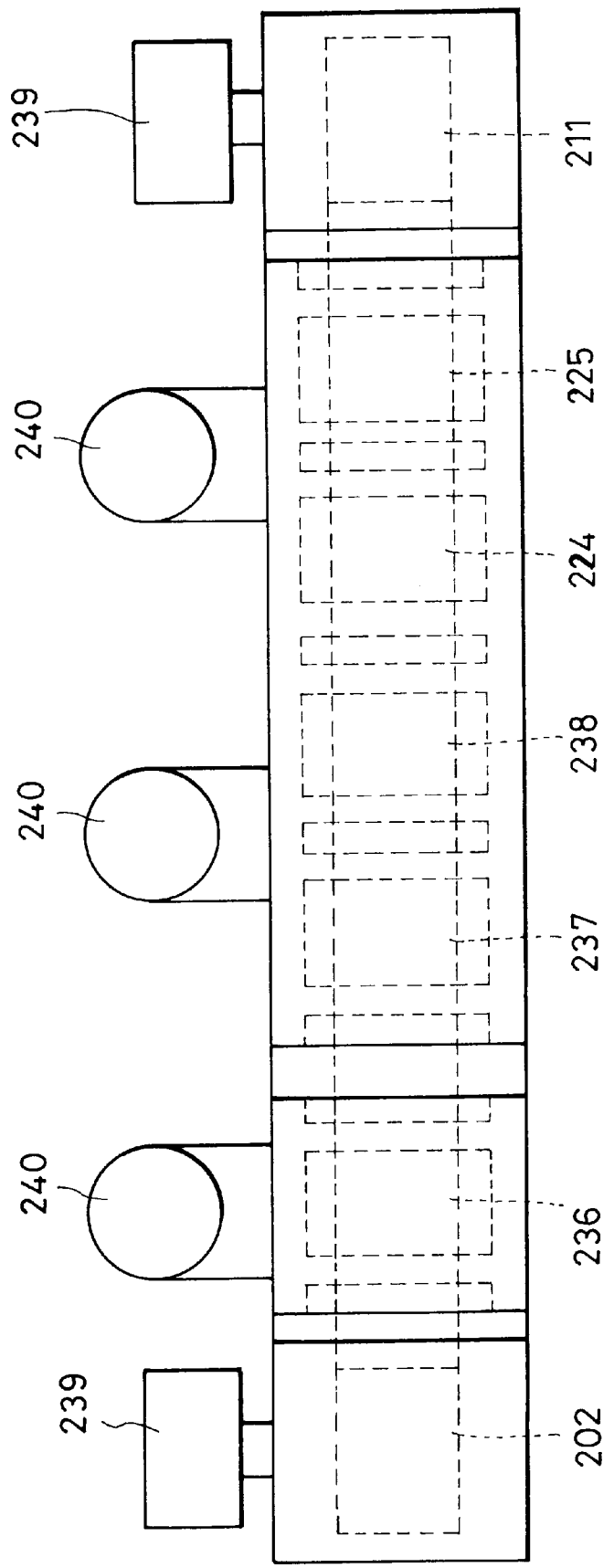
FIG. 2 is a schematic cross-sectional diagram showing an embodiment of an apparatus for producing a reflecting layer and a transparent conductive layer of a photoelectric conversion element of the present invention.
Figure 2B:
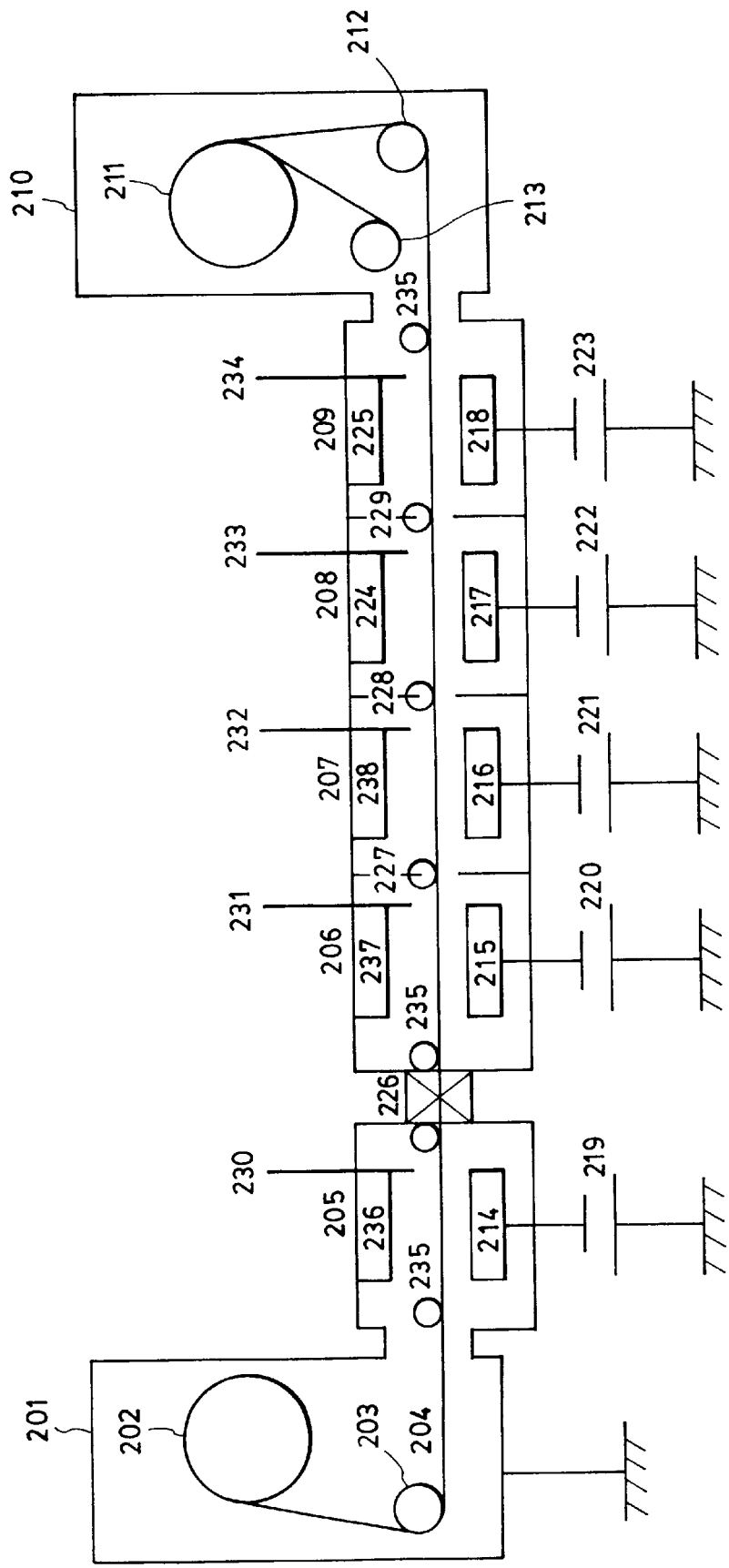

FIGS. 2A, 2B are schematic cross-sectional diagrams showing a production apparatus for producing a photoelectric conversion element shown in FIG. 1 on a longitudinal substrate; FIG. 2A is a schematic top view, and FIG. 2B is a schematic cross-sectional view. With the apparatus, film formation and surface treatment of the reflecting layer 102, and film formation of the transparent conductive layer 103 can be conducted by the following procedure.

(1) With a band-like substrate 204 wound in a roll-like manner laid across a feeding chamber 201 and a winding chamber 201, the chambers are evacuated with vacuum pumps 239, 240.

(2) After the evacuation to a certain pressure, an inert gas such as an argon gas is supplied from gas supply tubes 230, 233, 234, and a gas containing an oxygen gas is supplied from gas supply tubes 231, 232 while controlling the pressure at the certain level by adjusting the open degree of an exhaust valve (not illustrated). By switching on a plurality of infrared ray lamps in heater units 236, 237, 238, 224, 225 provided in the chambers, the apparatus inner wall, partition plates 227, 228, 229, and the substrate 204 are heated. The temperature is controlled at a level higher than the film formation temperature by a temperature sensor provided in the vicinity of the substrate. At the time, it is preferable to generate discharge by supplying an electric power to the processing chambers.

It is also possible to switch off the heating lamps after having a temperature higher than the film forming temperature for cooling off for about the heating time, and heat again. The temperature cycle process has an effect of contracting the material comprising the apparatus, and as a consequence, preventing gas accumulation. This is particularly effective for an apparatus with complicated components. For example, it is highly effective when a magnet roller 235, and the like accommodating a magnet for maintaining a substrate at a predetermined position is used.

(3) After heating for a predetermined time, cooling or self-cooling is conducted to have a predetermined film forming temperature. Then, after rotating a winding roll 211 by a servo motor (not illustrated) so as to convey the band-like substrate 204 at a constant rate, the film formation is started.

(4) In a reflecting layer producing chamber 205, with a target 214 made from aluminum or a material containing aluminum as the cathode electrode, sputtering is conducted with a direct current power source 219 so as to produce the reflecting layer 102. For the sputtering method, magnetron sputtering can be used.

(5) The substrate 204 with the formed reflecting layer is conveyed to pass through active oxygen or oxygen ion treating chambers (hereinafter abbreviated as oxygen treatment chamber) 206, 207 for generating the glow discharge in an atmosphere containing an oxygen gas with direct current power sources 220, 221 so as to have the surface 100 of the reflecting layer contact with active oxygen and/or oxygen ion in the metastable state, such as radicals, atomic state, excited state, and the like. The gap between the substrate and the inter-chamber communicating path is narrowed between the oxygen treatment chamber and the reflecting layer producing chamber with a gas gate or a pinch valve 226 for providing an inert gas, such as an argon gas disposed so that the amount of the oxygen gas in the oxygen treatment chambers 206, 207 introduced into the reflecting layer producing chamber 205 can be limited.

(6) With the substrate 204 passed through the oxygen treatment chambers 206, 207 conveyed to transparent conductive layer producing chambers 208, 209, sputtering is conducted to targets 217, 218 mainly containing zinc oxide by applying a direct current voltage with direct current power sources 222, 223 so as to produce the transparent conductive layer 103. Then it is wound on a winding reel 211 in the winding chamber 210. By optionally selecting the production temperature and the direct current power at the time, a ruggedness of about several 100 nm size can be formed on the surface of the transparent conductive layer so that the effect of scattering of light can be utilized. In FIG. 1, the ruggedness is described schematically in an exaggerated manner.

As heretofore mentioned, the reflecting layer and the transparent electrode can be formed continuously on the substrate. When the transparent conductive layer is an oxide film, the oxygen treatment chamber and the transparent conductive layer producing chamber needs not be strictly separated, but it is possible to provide only a simple partition for limiting the wrap around of the film.

It is conceivable that argon is introduced to the oxygen treatment chambers 206, 207 and an oxygen gas is introduced to the transparent conductive layer producing chambers 208, 209. Therefore, depending on the material to be deposited, a gas gate, a pinch valve, and the like can be provided so as to separate the treatment chambers.

As shown in FIG. 2, it is preferable that the transparent conductive layer is deposited in a plurality of producing chambers. It was learned that in particular, a photoelectromotive force element having a transparent conductive layer deposited with the production temperature in the producing chamber 208 lower than the production temperature in the producing chamber 209 has excellent characteristics.

The semiconductor layer 104 having a semiconductor junction comprising the n type a-Si layer 105, the i type a-Si layer 106, the p type a-Si layer 107 is formed on the accordingly formed transparent conductive layer 103 with another vacuum device (for example, a plasma CVD device). As shown in FIG. 1, when the semiconductor layer 104 is thin, the semiconductor junction as a whole tends to have the rugged structure the same as the transparent conductive layer 103. The transparent electrode, which also serves as a reflection preventing layer 108 is formed on the semiconductor junction with another vacuum device. Thereon, the comb-like collecting electrode 109 and the output terminal 110 are provided. The protecting resin is provided for protection.

Accordingly, the photoelectric conversion element as shown in FIG. 1 can be obtained. In the photoelectric conversion element, the reflecting layer and the transparent conductive layer have a good reflectance so that a reflected light beam can be effectively absorbed in the semiconductor layer to improve the photoelectric conversion efficiency. Further, the characteristics can be maintained without a change over a long time to ensure high reliability.

Figure 3:
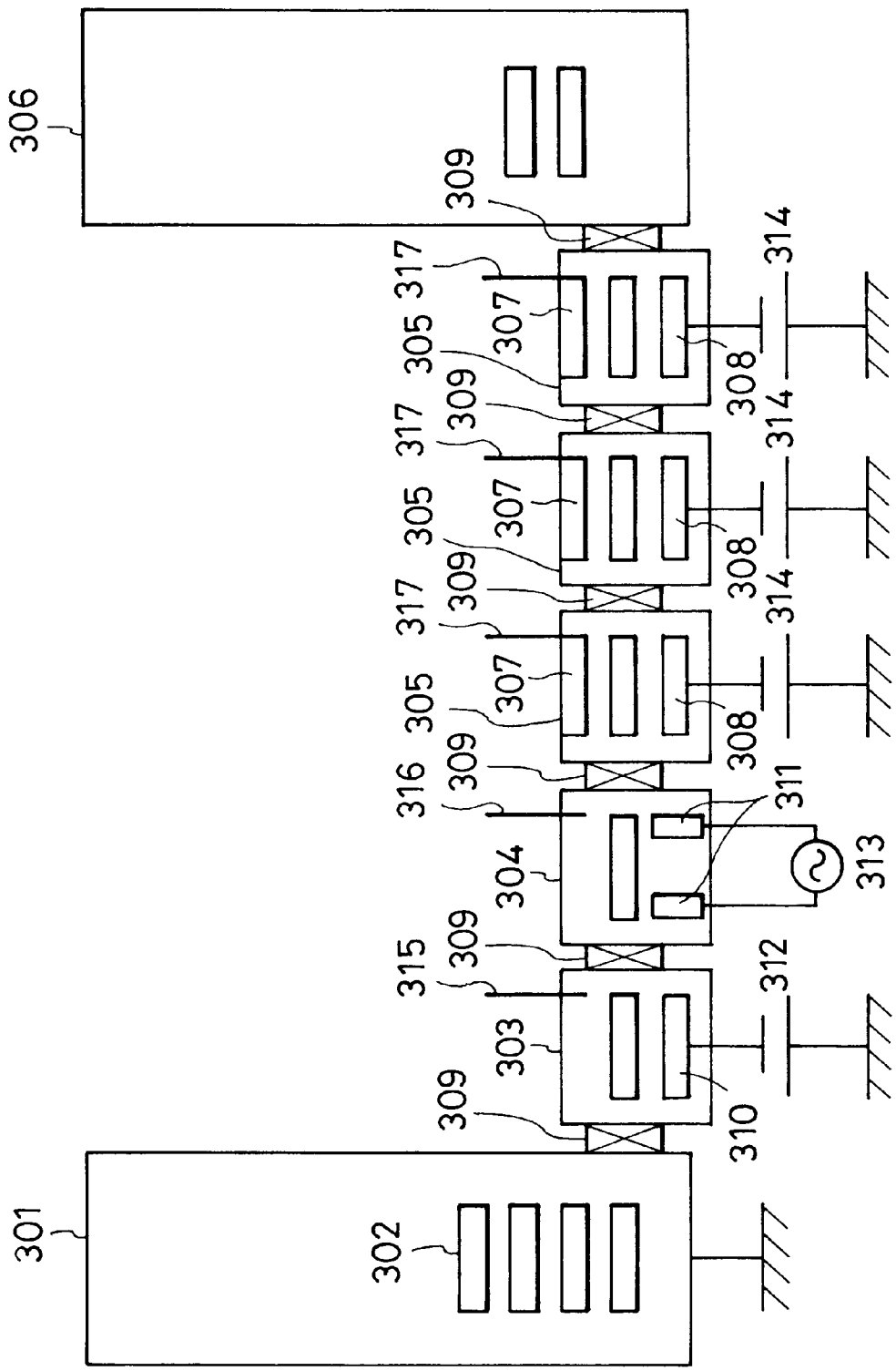
FIG. 3 is a schematic cross-sectional diagram showing another embodiment, which is different from the embodiment of FIG. 2, of an apparatus for producing a reflecting layer and a transparent conductive layer of a photoelectric conversion element of the present invention.

Although the roll to roll method using a band-like substrate has been described herein, the present invention is not limited to the method, but can be adopted to the single substrate process system inline method shown in FIG. 3.

The present inventor found out that the preliminary heating in the above-mentioned step (2) and the conversion efficiency of the photoelectric conversion element are interrelated. Specifically, the rugged shape of the transparent conductive layer 103 surface formed in the step (6) is changed according to the time of the preliminary heating. The present inventor had an experiment for examining the relationship with the conversion efficiency by changing the preliminary heating time from 0 minute to 720 minutes and the heating temperature from 250° C. to 600° C. Results are shown in Table 1. The preliminary heating temperature is plotted in the horizontal axis of the table, and the heating time is plotted in the vertical axis. Δ represents 1.0 to 1.05, ○ represents 1.05 to 1.15, and ⊙ represents 1.15 or more based on the conversion efficiency at 250° C. with 0 minute of the preliminary heating as 1.

TABLE 1

| | 250° C. | 350 | 400 | 450 | 500 | 550 | 600 |
|---|---|---|---|---|---|---|---|
| 0 (min) | Δ | Δ | Δ | Δ | Δ | Δ | Δ |
| 5 | Δ | Δ | Δ | Δ | Δ | Δ | Δ |
| 10 | Δ | ○ | ○ | ○ | ○ | ○ | Δ |
| 15 | Δ | ○ | ⊙ | ⊙ | ⊙ | ○ | Δ |
| 30 | Δ | ○ | ⊙ | ⊙ | ⊙ | ○ | Δ |
| 60 | Δ | ○ | ⊙ | ⊙ | ⊙ | ○ | Δ |
| 90 | Δ | ○ | ⊙ | ⊙ | ⊙ | ○ | Δ |
| 120 | Δ | ○ | ⊙ | ⊙ | ⊙ | ○ | Δ |
| 135 | Δ | ○ | ○ | ○ | ○ | ○ | Δ |
| 150 | Δ | Δ | Δ | Δ | Δ | Δ | Δ |
| 720 | Δ | Δ | Δ | Δ | Δ | Δ | Δ |

It was learned that the photoelectric conversion efficiency can be improved by the preliminary heating, but the conversion efficiency cannot be improved if the heating time is too long. Although the reason is not known, it can be considered that if a heating time is too long, the surface shape of the transparent conductive layer 103 cannot be appropriate for a photoelectric conversion element, or crystallization of the aluminum film is accelerated so that the grain boundary, which absorbs a light beam to deteriorate the reflectance, is developed. Therefore, it is preferable to conduct a preliminary heating in a range from 400° C. to 500° C. for 15 minutes to 120 minutes.

Hereinafter components of a photoelectric conversion element using a reflecting layer and a transparent conductive layer formed by the present invention will be explained in detail.

Substrate

When the substrate 101 has a conductivity, it also serves as an electrode. Examples of the substrate 101 material include tantalum, molybdenum, tungsten, stainless steel, aluminum, titanium, carbon sheets, lead-plated steel sheets, and resin films having a conductive layer. In particular, stainless steel sheets, zinc steel sheets, aluminum sheets, and the like are preferable since they can be obtained at a comparatively low cost and can be used in a roll-like shape, which is suitable for the continuous operation. According to the application, crystal substrates such as silicon, glass or ceramic sheets can be used as well. The substrate surface can be polished, but a substrate with a good finish state, such as a stainless steel sheet applied with a bright annealing processing can be used as is with only a water-washing treatment and a blow drying treatment. Those having a ruggedness such as dull finish and glare-reducing finish can be used as well.

When a stainless steel sheet is used, by the use of a ferromagnetic material such as SUS430, it can be conveyed with the position accurately controlled with a roller accommodating a magnet.

Reflecting Layer

Al, Ag, Cu, and the like can be used for the reflecting layer 102. Since Al does not cause a problem of migration, it can be used particularly preferably. The surface can be either smooth or rugged. Production can be conducted by a sputtering method, a vacuum deposition method, a chemical gas phase growth method, an ion plating method, or an ion beam method. The reflecting layer 102 can be used also as an electrode.

With reference to FIG. 2, a current magnetron sputtering method, which is an example of the reflection layer 102 forming method, will be described. Numeral 205 is a producing chamber having an exhaust pump 240 for evacuation. To the producing chamber, an inert gas such as argon is introduced at a predetermined flow rate using a mass flow controller from a gas introduction tube 230 connected with a gas bomb (not illustrated), with the inside of the producing chamber 205 controlled at a predetermined pressure by adjusting the open degree of the exhaust valve. A target is fixed to a cathode electrode 214, which accommodates a magnet (not illustrated). A direct current power source 219 is connected to the cathode electrode 214 for supplying an electric power for sputtering.

Active Oxygen and/or Oxygen Ion Treatment of the Reflecting Layer Surface

As the method for generating active oxygen and/or oxygen ion to be contacted with the produced reflecting layer, a direct current method using an anode electrode and a cathode electrode, an alternative current method, a high frequency method, a hollow cathode type ion beam method, and a microwave method can be used. The substrate with the formed reflecting layer can be passed through the space where discharge is generated while supplying an oxygen gas, such as the oxygen treatment chambers 206, 207 of FIG. 2.

At the time, since introduction of oxygen from the oxygen treatment chambers to the reflecting layer producing chamber can be another factor to deteriorate the reflectance, it needs to be limited at less than a certain amount. As the method therefor, a commonly known gate 226 with a narrow gap and a long length for a smaller conductance is effective. Further, it is also possible to improve the separation ability of the atmosphere gas by supplying an inert gas to the upper and lower surfaces of the substrate of the gate 226. Further, it is also possible to stop the movement of the longitudinal substrate 204 at the time of the film formation treatment or the active oxygen treatment by using a pinch valve, and closing the valve.

Transparent Conductive Layer

The transparent conductive layer 103 can be produced by a sputtering method, a vacuum deposition method, a chemical gas phase growth method, an ion plating method, or an ion beam method. It is preferable to have a high transparency for transmitting a light beam to the reflecting layer. Further, it is preferable to have an appropriate degree of a resistance to restrain the current flowing through a defect of the semiconductor layer. Specifically, the conductive ratio is preferably $10^{-8}(1/\Omega$ cm) or more, but $10^{-1}(1/\Omega$ cm) or less.

As the material, zinc oxide, titanium oxide, indium oxide, tin oxide, and a material containing the same can be used. When an oxide is used, continuous production in the vacuum device the same as the active oxygen treatment chamber is possible. By appropriately selecting the production conditions, ruggedness of a several 100 nm can be produced on the surface so that the effect of scattering of light can be utilized. For example, by producing a first transparent conductive layer at a comparatively low film forming temperature, and forming a second transparent conductive layer at a temperature higher than the first transparent conductive layer forming temperature, a preferable rugged shape can be formed while maintaining adherence with the base.

Semiconductor layer

As the semiconductor layer 104, a non-single crystalline semiconductor can be preferably used. For the production, a CVD device utilizing a high frequency electric power, a VHF electric power, or a microwave electric power can be used. The semiconductor layer 104 can be formed in a film forming device interlocked with the film forming device for the reflecting layer 102 and the transparent conductive layer 103 so as to form a single vacuum chamber, or can be formed in an independent device.

While supplying a material gas such as $SiH_4$, $SiF_4$, $PH_3$, or $H_2$ to vacuum chamber, the electric power is supplied. Accordingly, the n type a-Si layer 105 can be formed on the transparent conductive layer 103. By using $SiH_4$, $SiF_4$, or $H_2$, the i type a-Si layer 106 can be formed on the a-Si layer 105. Further, by using $SiH_4$, $BF_3$, or $H_2$, the p type µc-Si layer 107 can be formed on the i type a-Si layer 106 so as to form the nip semiconductor junction. Whether to have an amorphous layer or a micro-crystal layer can be selected by the film forming conditions. The semiconductor layer is not limited to the amorphous or the micro-crystal, however, it is preferably a non-single crystal semiconductor layer. Further, the pin structure can be used instead of the nip structure. Moreover, the semiconductor junction can be provided in a plurality so as to have a tandem type or triple type structure.

Transparent Electrode

The transparent electrode 108, which also serves as a reflection preventing layer, is the electrode at the opposite side of the substrate with respect to the semiconductor layer. It is preferable that the transparent electrode has a low resistance and comprises indium oxide, tin oxide, titanium oxide, zinc oxide, or a mixture thereof. The transparent electrode can be produced by a vacuum deposition method with resistance heating or an electron beam, a sputtering method, a CVD method, a spray method, an immersion method, and the like with the above-mentioned materials as a raw material. In order to obtain a preferable reflection preventing effect, the film thickness of the transparent electrode is preferably about $\lambda/4n$, where the wavelength of the main light beam to prevent the reflection is represented by $\lambda$, and the reflectance of the transparent electrode is represented by n. Further, the transparent electrode can comprise a lamination of materials having different reflectances.

Collecting Electrode

In order to efficiently collect the current, the grid-like collecting electrode 109 can be provided on the transparent electrode. Examples of the material for the collecting electrode include metals such as Ti, Cr, Mo, W, Al, Ag, Ni, Cu, Sn, and the like, alloys of the metals, conductive pastes such as a silver paste. Examples of the collecting electrode forming method include a sputtering using a mask pattern, a resistance heating, a CVD method, a method of patterning by removing an unnecessary part by etching after forming a metal film on the entire surface by deposition, a method of directly forming a grid electrode pattern by a light CVD, a method of plating after forming a mask of a negative pattern of a grid electrode pattern, and a method of printing a conductive paste. As the conductive paste, in general, powdery silver, gold, copper, nickel, carbon, and the like dispersed in a binder resin is used. Examples of the binder resin include resins of polyester, epoxy, acrylic, alkyd, polyvinyl acetate, rubber, urethane, phenol, and the like.

After forming the collecting electrode, the output terminal 110 is attached to the substrate and the collecting electrode to take out the electromotive force. The output terminal can be attached to the substrate by a method of spot welding or soldering a metal body such as a copper tab. The output terminal can be attached to the collecting electrode by a method of electrically connecting a metal body with a conductive paste or soldering.

Protecting Resin

As the protecting resin 111, various kinds of resin films such as polyethylene terephthalate, nylon, polycarbonate, polyethylene, polypropylene, polyvinyl chloride, and acrylic can be used. The resin film can be attached to the photoelectric conversion element with an adhesive resin so as to serve as a protection material. As the adhesive resin, known materials such as acrylic, polyamide, polychloroprene rubber, butyl rubber, nitrile rubber, phenol, melamine, epoxy, and silicone can be used optionally.

EXAMPLE 1

In this embodiment, a photoelectric conversion element having the configuration shown in the cross-sectional diagram of FIG. 1 was produced with the apparatus shown in FIG. 2.

After opening the apparatus of FIG. 2 to the atmosphere for maintenance, and the like, the roll-like substrate 202 is set to the substrate feeding chamber 201, and the substrate 204 is laid through the reflecting layer producing chamber 205, the active oxygen treatment chambers 206, 207, the transparent conductive layer producing chamber 208, 209 so as to be fixed to the roll 211 in the substrate winding chamber 210. As the substrate 204, SUS430 having a 120 mm width, a 0.15 mm thickness, and a 150 m length with a dull finish was used.

Then the air was exhausted until the pressure became $10^{-4}$ torr or less. 30 sccm each of an argon gas was supplied as an inert gas to the reflecting layer producing chamber 205, and the transparent conductive layer producing chambers 208, 209 from the gas supply tubes 230, 233, 234. 10 sccm each of an oxygen gas was supplied to the oxygen treatment chambers 206, 207 from the gas supply tubes 231, 232. 30 sccm of an argon gas was supplied also to the gas 226. In the state, the pressure in the vacuum chamber was maintained at 3 mTorr by adjusting the open degree of the exhaust valve.

Heater units 236, 237, 238, 224, 225 having 6 pieces of 100 W infrared ray lamps were provided with a stainless steel reflecting plate to the reflecting layer producing chamber 205, the oxygen treatment chambers 206, 207, and the transparent conductive layer producing chambers 208, 209 so that the heating operation can be conducted while maintaining the temperature at 400° C. by contacting the thermocouple on the surface of the substrate opposite to the film forming surface. After reaching the set temperature in about 15 minutes and maintaining the state for about 2 hours, the heaters of the reflecting layer producing chamber 205 and the oxygen treatment chambers 206, 207 were switched off, the set temperature of the transparent conductive layer producing chamber 208 was lowered to 150° C., and the set temperature of the transparent conductive layer producing chamber was lowered to 250° C. In about 30 minutes, the temperature in the transparent conductive layer producing chamber was lowered to the set temperature.

The servo motor was operated to rotate the winding roll 211 so as to start the conveyance of the substrate 204 at a 170 mm/minute rate.

A 99.99% by weight purity aluminum used for the target 214 for producing the reflecting layer having a 25 cm×25 cm size was applied with a 400 W direct current electric power. During about 90 seconds in which the substrate 204 passed above the target 214, an aluminum reflecting layer 101 having about 200 nm thickness was produced.

40 W direct current electric power was applied to each of the cathode electrodes 215, 216 of the oxygen treatment chambers 206, 207. The substrate 204 having the formed reflecting layer was conveyed so as to contact with a plasma containing an oxygen gas during about 180 seconds to pass through the oxygen treatment chamber. In this embodiment, an aluminum target was used for the cathode electrode 215, and a zinc oxide target was used for the cathode 216. Both of them have a 99.99% by weight purity and a 25 cm×25 cm size.

The substrate 204 was conveyed to the transparent conductive layer producing chambers 208, 209. Using zinc oxide targets 217, 218 having a 99.99% by weight purity and a 25 cm×25 cm size, a 2800 W direct current electric power was applied to each of them. During about 180 seconds to pass through the space, about 1000 nm of the transparent conductive layer 103 of zinc oxide was produced. At the time, a ruggedness having about several 100 nm in the difference of elevation was developed on the surface of the transparent conductive layer.

The substrate 204 having the produced transparent conductive layer was wound at the winding chamber 210. A polyester film guard sheet 213 was interposed between the substrates so as not to damage the surface of the transparent conductive layer.

While maintaining the state for about 10 hours, the reflecting layer and the transparent conductive layer were produced in about 100 m at about 170 mm/minute conveying rate.

A part of the substrate having the formed reflecting layer and transparent conductive layer was taken out for measuring the reflectance with a spectrophotometer. A 120% high reflectance was shown at a 800 nm wavelength based on the reflectance of Comparative Example 1 to be later described as 100%.

The substrate having the formed reflecting layer and transparent conductive layer was cut into a 5 cm×5 cm size, and set to a commercially available capacitive coupling type high frequency CVD device. The roughing and high vacuuming operation was conducted by the exhaust pump via the exhaust tube of the reaction container. At the time, the surface temperature of the substrate was controlled with a temperature controlling mechanism so as to be at 250° C. When the exhaust was sufficiently conducted, 1 sccm of $Si_2H_6$, 0.5 sccm of $PH_3/H_2(PH_3:1\%)$ and 40 sccm of $H_2$ were introduced from the gas introducing tube. With the internal pressure of the reaction container maintained at 1 torr by adjusting the open degree of the throttle valve, a 3 W electric power was applied from the high frequency power source immediately when the pressure become stable. The plasma was maintained for 180 seconds. Accordingly, the n type a-Si layer 105 was formed on the transparent layer 103. After exhausting again, 40 sccm of $Si_2H_6$ and 40 sccm of $H_2$ were introduced from the gas introducing tube. With the internal pressure of the reaction container maintained at 1 torr by adjusting the open degree of the throttle valve, a 2 W electric power was applied from the high frequency power source immediately when the pressure become stable. The plasma was maintained for 60 seconds. Accordingly, the i type a-Si layer 106 was formed on the n type a-Si layer 105. After exhausting again, 0.5 sccm of $SiH_4/H_2$ ($SiH_4:10\%$), 1 sccm of $BF_3/H_2$ ($BF_3:1\%$) and 50 sccm of $H_2$ were introduced from the gas introducing tube. With the internal pressure of the reaction container maintained at 1 torr by adjusting the open degree of the throttle valve, a 200 W electric power was applied from the high frequency power source immediately when the pressure become stable. The plasma was maintained for 120 seconds. Accordingly, the p type $\mu c$-Si layer 107 was formed on the i type a-Si layer 106.

The specimen was taken out from the high frequency CVD device so as to be attached on the surface of the anode of a DC magnetron sputtering device. With the periphery of the specimen blocked with a stainless steel mask, sputtering was conducted to the center part of 4.5 cm×4.5 cm size using a target containing 10% by weight of tin oxide and 90% by weight of indium oxide. The deposition was conducted with the conditions with a 200° C. substrate temperature, a 50 sccm flow rate of an argon gas as the inert gas, 0.5 sccm flow rate of an oxygen gas, a 3 mTorr pressure in the depositing chamber, and a 0.2 W/cm$^2$ applied electric force so as to have about 60 nm thickness in about 100 seconds. A predetermined film thickness was obtained by depositing with reference to the relationship with the depositing time preliminarily measured in the same conditions.

A silver paste was screen printed on the specimen accordingly produced. The collecting electrode 109 was formed on a 2% region on the area, the output terminal 110 was attached, and the protecting resin 111 was adhered. By the characteristic evaluation under the light radiation of AM1.5 (100 mW/cm$^2$), an excellent 120% photoelectric conversion efficiency was obtained based on the conversion efficiency of Comparative Example 1 to be later described as 100%.

With the sample, a 1000 hour environmental test was further conducted in an environmental test box with a 85° C. temperature and a 85% humidity. The conversion efficiency was lowered only by 0.02%, and thus it was not at all problematic.

EXAMPLE 2

With the conditions the same as Example 1, except that the heating operation was conducted for 2 hours such that the heater units 236, 237, 238, 224, 225 were controlled to maintain 500° C. after the evacuation and the gas supply, the sample was produced.

The reflectance of the substrate having the formed reflecting layer and transparent conductive layer was measured with a spectrophotometer. A 120% high reflectance was shown at a 800 nm wavelength based on the reflectance of Comparative Example 1 to be later described as 100%. Further, after the completion, by the characteristic evaluation under the light radiation of AM1.5 (100 mW/cm$^2$), an excellent 120% photoelectric conversion efficiency was obtained based on the conversion efficiency of Comparative Example 1 to be later described as 100%.

With the sample, a 1000 hour environmental test was further conducted in an environmental test box with a 85° C. temperature and a 85% humidity. The conversion efficiency was lowered only by 0.03%, and thus it was not at all problematic.

EXAMPLE 3

With the conditions the same as Example 1 except that the heating operation was conducted such that the heater units 236, 237, 238, 224, 225 were controlled to maintain 400° C. after the evacuation and the gas supply, after reaching the set temperature in about 15 minutes and maintaining the state for about 15 minutes, the heaters were switched off and left for about 15 minutes, then the heating operation was conducted again such that a 400° C. temperature can be maintained and after reaching the set temperature in about 10 minutes, the state was maintained for about 15 minutes, the sample was produced.

The reflectance of the substrate having the formed reflecting layer and transparent conductive layer was measured with a spectrophotometer. A 120% high reflectance was shown at a 800 nm wavelength based on the reflectance of Comparative Example 1 to be later described as 100%. Further, after the completion, by the characteristic evaluation under the light radiation of AM1.5 (100 mW/cm$^2$), an excellent 120% photoelectric conversion efficiency was obtained based on the conversion efficiency of Comparative Example 1 to be later described as 100%.

With the sample, a 1000 hour environmental test was further conducted in an environmental test box with a 85° C. temperature and a 85% humidity. The conversion efficiency was lowered only by 0.03%, and thus it was not at all problematic.

EXAMPLE 4

With the conditions the same as Example 1, except that the heating operation was conducted for 1 hour such that the heater units 236, 237, 238, 224, 225 were controlled to maintain 400° C. after the evacuation and the gas supply, the sample was produced.

The reflectance of the substrate having the formed reflecting layer and transparent conductive layer was measured with a spectrophotometer. A 120% high reflectance was shown at a 800 nm wavelength based on the reflectance of Comparative Example 1 to be later described as 100%. Further, after the completion, by the characteristic evaluation under the light radiation of AM1.5 (100 mW/cm$^2$), an excellent 117% photoelectric conversion efficiency was obtained based on the conversion efficiency of Comparative Example 1 to be later described as 100%.

With the sample, a 1000 hour environmental test was further conducted in an environmental test box with a 85° C. temperature and a 85% humidity. The conversion efficiency was lowered only by 0.04%, and thus it was not at all problematic.

Comparative Example 1

With the conditions the same as Example 1 except that only the heater units 224, 225 were heated to 150° C. and 250° C., respectively, after the evacuation and the gas supply, conveyance was started without the preliminary heating, both of the oxygen treatment chambers 206, 207 were provided with the same amount of the oxygen gas but not provided with the direct current electric power, and the surface of the reflecting layer was not exposed to the active oxygen and/or the oxygen ion, the sample was produced.

The reflectance of the substrate having the formed reflecting layer and transparent conductive layer was measured with a spectrophotometer so as to be the comparison criterion as 100% for the reflectance. Further, after the completion, the characteristic was evaluated under the light radiation of AM1.5 (100 mW/cm$^2$) so as to be the comparison criterion as 100% for the photoelectric conversion efficiency.

EXAMPLE 5

With the conditions the same as Example 1 except that only the heater units 224, 225 were heated to 150° C. and 250° C., respectively, after the evacuation and the gas supply, conveyance was started without the preliminary heating, and the sample was produced.

After completion, by the characteristic evaluation under the light radiation of AM1.5 (100 mW/cm$^2$), a 114% photoelectric conversion efficiency was obtained based on the conversion efficiency of Comparative Example 1 as 100%.

EXAMPLE 6

With the conditions the same as Example 1 except that only the heater units 224, 225 were heated to 150° C. and 250° C., respectively, after the evacuation and the gas supply, conveyance was started after maintaining the state for 12 hours, and the sample was produced.

After completion, by the characteristic evaluation under the light radiation of AM1.5 (100 mW/cm$^2$), a 114% photoelectric conversion efficiency was obtained based on the conversion efficiency of Comparative Example 1 described as 100%.

Reference Example 1

With the conditions the same as Example 1 except that the direct current electric power of the oxygen generating chamber 206 was 400 W, the sample was produced. After completion, by the characteristic evaluation under the light radiation of AM1.5 (100 mW/cm$^2$), only an 88% photoelectric conversion efficiency was obtained based on the conversion efficiency of Comparative Example 1 as 100%. The reason thereof is considered that aluminum oxide was adhered to the reflecting layer.

Reference Example 2

With the conditions the same as Example 1 except that the argon gas supply to the gas gate 226 was stopped and the argon gas supply amount to the reflecting layer producing chamber 205 was reduced to 5 sccm, the sample was produced. After completion, by the characteristic evaluation under the light radiation of AM1.5 (100 mW/cm$^2$), only an 80% photoelectric conversion efficiency was obtained based on the conversion efficiency of Comparative Example 1 as 100%. The reason therefore is believed to be that the reflecting layer was oxidized.

In order to examine the degree of oxygen introduction influence, the sample was produced up to the transparent conductive layer using the process of Example 1 with the oxygen gas intentionally mixed with the argon gas provided to the reflecting layer producing chamber. With the oxygen gas amount of 2 sccm, 4 sccm, and 8 sccm in the total flow rate of 35 sccm, the reflectances at a 800 nm wavelength based on the reflectance of Comparative Example 1 as 100% were 120%, 115%, and 85%, respectively. With the 4 sccm or more, that is, about 10% oxygen introduction rate, deterioration of the reflectance was observed.

EXAMPLE 7

In this embodiment, a photoelectric conversion element having the configuration shown in FIG. 1 was produced without using the heaters 236, 237, 238.

The stainless steel roll 202 of SUS430 having a 120 mm width, a 0.15 mm thickness, and a 150 m length with the ruggedness on the surface by the dull finish was set in the apparatus shown in FIG. 2 as the substrate 101. Then the air was exhausted until the pressure became 10$^{-4}$ torr or less. 30 sccm each of an argon gas was supplied as an inert gas to the reflecting layer producing chamber 205, and the transparent conductive layer producing chambers 208, 209 from the gas supply tubes 230, 233, 234. 10 sccm of an oxygen gas was supplied to each of the oxygen ion generating chambers 206, 207 from the gas supply tubes 231, 232. 30 sccm of an argon gas was supplied also to the gas gate 226. The pressure in the vacuum chamber was maintained at 3 mTorr by adjusting the open degree of the exhaust valve.

The servo motor was operated to rotate the winding roll 211 to start the conveyance of the substrate 204 at 170 mm/minute.

A 99.99% by weight purity aluminum used for the target 214 for producing the reflecting layer having a 25 cm×25 cm size was applied with a 400 W direct current electric power. During about 90 seconds in which the substrate 204 passed above the target 214, an aluminum reflecting layer 102 having about 200 nm thickness was produced.

40 W direct current electric power was applied to each of the cathode electrodes 215, 216 of the oxygen treatment chambers 206, 207. The substrate 204 having the formed reflecting layer was conveyed to contact with a plasma containing an oxygen gas during about 180 seconds to pass through the oxygen treatment chamber. An aluminum target having a 99.99% by weight purity and a 25 cm×25 cm size was used for the cathode electrode 215, and a zinc oxide target having a 99.99% by weight purity and a 25 cm×25 cm size was used for the cathode 216.

The substrate 204 was conveyed to the transparent conductive layer producing chambers 208, 209. Using zinc oxide targets 217, 218 having a 99.99% by weight purity and a 25 cm×25 cm size, a 800 W direct current electric power was applied to each of them. During the about 180 seconds it took to pass through the space, the transparent conductive layer 103 comprising a 1000 nm zinc oxide film was produced. With the substrate temperature adjusted to 150° C. and 250° C. with the heater units 224, 225 using an infrared ray lamp, a ruggedness having about several 100 nm size was developed on the surface of the transparent conductive layer.

The substrate 204 having the transparent conductive layer was wound on the reel 211 at the winding chamber 210. A polyester film guard sheet 213 was interposed between the substrates so as not to damage the surface of the transparent conductive layer.

While maintaining this state for about 10 hours, the reflecting layer and the transparent conductive layer were produced in about 100 m at about a 170 mm/minute conveying rate.

A part of the substrate having the formed reflecting layer and transparent conductive layer was taken out to measure the reflectance with a spectrophotometer. A 66% reflectance was shown as the oscillation central value with respect to a 800 nm interference.

The substrate having the formed reflecting layer and transparent conductive layer was cut into a 5 cm×5 cm size, and set to a commercially available capacitive coupling type high frequency CVD device. The roughing and high vacuuming operation was conducted by the exhaust pump via the exhaust tube of the reaction container. At the same time, the surface temperature of the substrate was controlled with a temperature controlling mechanism so as to be at 250° C. When the exhaust was sufficiently conducted, 300 sccm of SiH$_4$, 4 sccm of SiF$_4$, 55 sccm of PH$_3$/H$_2$(PH$_3$:1%) and 40 sccm of H$_2$ were introduced from the gas introducing tube. With the internal pressure of the reaction container maintained at 1 Torr by adjusting the open degree of the throttle valve, a 200 W electric power was applied from the high frequency power source immediately when the pressure became stable. The plasma was maintained for 5 minutes. Accordingly, the n type a-Si layer 105 was formed on the transparent layer 103. After exhausting again, 300 sccm of SiH$_4$, 4 sccm of SiF$_4$, and 40 sccm of H$_2$ were introduced from the gas introducing tube. With the internal pressure of the reaction container maintained at 1 Torr by adjusting the open degree of the throttle valve, a 150 W electric power was applied from the high frequency power source immediately when the pressure become stable. The plasma was maintained for 40 minutes. Accordingly, the i type a-Si layer 106 was formed on the n type a-Si layer 105. After exhausting again, 50 sccm of $SiH_4$, 50 sccm of $BF_3/H_2$ ($BF_3:H_2$1%), and 500 sccm of $H_2$ were introduced from the gas introducing tube. With the internal pressure of the reaction container maintained at 1 Torr by adjusting the open degree of the throttle valve, a 300 W electric power was applied from the high frequency power source immediately when the pressure became stable. The plasma was maintained for 2 minutes. Accordingly, the p type μc-Si layer 107 was formed on the i type a-Si layer 106 so as to form the semiconductor layer on the transparent conductive layer 103.

The specimen after the semiconductor 104 formation was taken out from the high frequency CVD device so as to be attached on the surface of the anode of a DC magnetron sputtering device. With the periphery of the specimen blocked with a stainless steel mask, sputtering was conducted to the center part of 4.5 cm×4.5 cm size using a target containing 10% by weight of tin oxide and 90% by weight of indium oxide. The film deposition was conducted with a 200° C. substrate temperature, a 50 sccm flow rate of an argon gas as the inert gas, 0.5 sccm flow rate of an oxygen gas, a 3 mTorr pressure in the depositing chamber, and a 0.2 $W/cm^2$ applied electric force per a unit area of the target so as to have about 60 nm thickness in about 100 seconds so as to form the transparent electrode 108 on the p type μc-Si layer 107. A predetermined film thickness was obtained by depositing with reference to the relationship with the depositing time preliminarily measured in the same conditions.

A silver paste was screen printed on the transparent electrode 108 accordingly produced. The collecting electrode 109 was formed on a 2% region on the surface area of the transparent electrode, the output terminal 110 was attached, and the protecting resin 111 was adhered. Accordingly, a photoelectric conversion element having the configuration shown in FIG. 1 was obtained. By the characteristic evaluation of the photoelectric conversion element under the light radiation of AM1.5 (100 $mW/cm^2$), an excellent 9.4% photoelectric conversion efficiency was obtained.

With the sample, a 1000 hour environmental test was further conducted in an environmental test box with a 85° C. temperature and a 85% humidity. The conversion efficiency was lowered only by 0.02%, and thus it was not at all problematic.

EXAMPLE 8

In the process the same as Example 7 except that electric power was not supplied to one 207 of the oxygen treatment chambers without generating discharge but only the other one 206 was used, and a 40 W direct current electric power was applied with an aluminum target, a photoelectric conversion element was produced. The reflectance of the substrate having the formed reflecting layer and transparent conductive layer was measured with a spectrophotometer. A 65% reflectance was shown as the oscillation central value with respect to a 800 nm interference. By the characteristic evaluation of the photoelectric conversion element under the light radiation of AM1.5 (100 $mW/cm^2$), the photoelectric conversion efficiency was 9.4%.

With the sample, a 1000 hour environmental test was further conducted in an environmental test box with a 85° C. temperature and a 85% humidity. The conversion efficiency was lowered only by 0.03%, and thus it was not at all problematic.

EXAMPLE 9

In the process the same as Example 7 except that electric power was not supplied to one 206 of the oxygen treatment chambers without generating discharge but only the other one 207 was used, and a 80 W direct current electric power was applied with a zinc oxide target, a photoelectric conversion element was produced. The reflectance of the substrate having the formed reflecting layer and transparent conductive layer was measured with a spectrophotometer. A 64% reflectance was shown as the oscillation central value with respect to a 800 nm interference. By the characteristic evaluation of the photoelectric conversion element under the light radiation of AM1.5 (100 $mW/cm^2$), the photoelectric conversion efficiency was 9.3%.

With the sample, a 1000 hour environmental test was further conducted in an environmental test box with a 85° C. temperature and a 85% humidity. The conversion efficiency was lowered only by 0.02%, and thus it was not at all problematic.

Comparative Example 2

In the process the same as Example 7 except that the same amount of an oxygen gas was supplied but direct current electric power was not supplied to both of the oxygen treatment chambers 206, 207, and the surface of the reflecting layer was not exposed to the active oxygen and/or the oxygen ion, a photoelectric conversion element was produced. The reflectance of the substrate having the formed reflecting layer and transparent conductive layer was measured with a spectrophotometer. A 55% reflectance was shown as the oscillation central value with respect to a 800 nm interference. By the characteristic evaluation of the photoelectric conversion element under the light radiation of AM1.5 (100 $mW/cm^2$), the photoelectric conversion efficiency was 8.2%. It was found that the photoelectric conversion element has a lower reflectance and a lower photoelectric conversion efficiency with respect to the sample of Example 7. It can be considered that a light beam was absorbed by the crystal grain of the aluminum film.

Reference Example 3

In the process the same as Example 7 except that the direct current electric power in the oxygen treatment chamber 206 was used, a photoelectric conversion element was produced. The reflectance of the substrate having the formed reflecting layer and transparent conductive layer was measured with a spectrophotometer. A 51% reflectance was shown as the oscillation central value with respect to a 800 nm interference. By the characteristic evaluation of the photoelectric conversion element under the light radiation of AM1.5 (100 $mW/cm^2$), the photoelectric conversion efficiency was 7.2%. It was found that the photoelectric conversion element has a lower reflectance and a lower photoelectric conversion efficiency with respect to the sample of Example 7. It is believed that the aluminum target was sputtered farther than the degree of providing the effect of preferably keeping the oxygen ion reflectance so that the oxidized aluminum film was adhered.

Reference Example 4

In the same process as Example 7, except that the argon gas supply to the gas gate 226 was stopped and the argon gas supply amount to the reflecting layer producing chamber 205 was reduced to 5 sccm, a photoelectric conversion element was produced. The reflectance of the substrate having the formed reflecting layer and transparent conductive layer was measured with a spectrophotometer. A 49% reflectance was shown as the oscillation central value with respect to a 800 nm interference. By the characteristic evaluation of the photoelectric conversion element under the light radiation of AM1.5 (100 mW/cm$^2$), the photoelectric conversion efficiency was 6.3%. It was found that the photoelectric conversion element has a lower reflectance and a lower photoelectric conversion efficiency with respect to the sample of Example 7. It is believed that the aluminum film of the reflecting layer was oxidized by the oxygen introduction.

In order to examine the degree of oxygen influence, the sample was produced to the transparent conductive layer in the same process as Example 7, by providing a gas to the gas gate and supplying a gas mixture containing oxygen and argon from the gas supply tube 230. With the oxygen gas amount of 2 sccm, 4 sccm, and 8 sccm in the total flow rate of 35 sccm, the reflectances as the oscillation central value with respect to a 800 nm interference were 63%, 61%, and 47%, respectively. With the 4 sccm or more, that is, about 10% oxygen introduction rate, remarkable deterioration of the reflectance was observed.

EXAMPLE 10

In this embodiment, a photoelectric conversion element shown in FIG. 1 was produced with the single substrate process system inline method vacuum device shown in FIG. 3.

10 pieces of stainless steel roll substrates having a 0.13 mm thickness and a 120 mm×120 mm size, with the surface applied with the bright annealing treatment were set in a load chamber 301 of the vacuum device shown in FIG. 3 at the same time as the substrate 101. Then the air was exhausted until the pressure became 10$^{-4}$ torr or less. 30 sccm each of an argon gas was supplied as an inert gas to a reflecting layer producing chamber 305, and a transparent conductive layer producing chamber 305 from gas supply tubes 315, 317. The pressure in the vacuum chamber was maintained at 3 mTorr by adjusting the exhaust valve. 10 scam of an oxygen gas was supplied to an oxygen treatment chamber 304 from a gas supply tube 316 while maintaining the pressure at 0.1 Torr.

A gate valve 309 was opened to send out the substrate 302 to the reflecting layer forming chamber 303. After the pressure became stable, the following film formation process was conducted.

A 99.99% by weight purity aluminum having a 25 cm×25 cm size used for a target 310 for producing the reflecting layer was applied with a 400 W direct current electric power for about 90 seconds to form an aluminum reflecting layer 102 having about 200 nm thickness.

The gate valve was opened so that the substrate 302 having the formed reflecting layer 102 was moved to the oxygen treatment chamber 304, and at the same time, the next substrate was moved from the load chamber 301 to the reflecting layer forming chamber 303. To an opposite electrode 311 in the oxygen treatment chamber 304, a high frequency electric power of 13.56 MHz and 40 W was applied so that the surface of the reflecting layer was contacted with a plasma containing an oxidized gas for 90 seconds.

The gate valve 309 was opened again so that the substrate 302 was sent out to the transparent conductive layer forming chamber 305, and at the same time, the next substrate was moved.

In the transparent conductive layer forming chamber, a zinc oxide target 308 having a 99.99% by weight purity and a 25 cm×25 cm size was used and a 800 W direct current electric power was applied for 90 seconds. As shown in FIG. 3, three film forming chambers 305 of the same condition were provided. By processing in the film forming chambers with the above-mentioned conditions, transparent conductive layer 103 about 1000 nm thick was formed on the reflecting layer 102. At the time, the substrate temperature was adjusted to 250° C. with a heater unit 307 using an infrared ray lamp.

The substrate 302 having the produced transparent conductive layer 103 was collected at an unload chamber 306.

By repeating the above-mentioned operation, the reflecting layer and the transparent conductive layer were formed on the 9 substrates under the same conditions.

A part of the substrate having the formed reflecting layer and transparent conductive layer was taken out for measuring the reflectance with a spectrophotometer. A 66% reflectance was shown as the oscillation central value with respect to a 800 nm interference.

Three of the substrates having the formed reflecting layer and transparent conductive layer were cut into a 5 cm×5 cm size. As in Example 7, a semiconductor layer 104, a transparent electrode 108, and a collecting electrode 109 were formed, and an output terminal 110, a protecting resin 111 were provided. Accordingly, 3 pieces of photoelectric conversion element samples were obtained.

By the characteristic evaluation of the photoelectric conversion elements under the light radiation of AM1.5 (100 mW/cm$^2$), an excellent 9.4±1% photoelectric conversion efficiency was obtained for all of them.

With the three samples, a 1000 hour environmental test was further conducted in an environmental test box with a 85° C. temperature and a 85% humidity. The conversion efficiency was lowered only by 0.01 to 0.02% for all of them, and thus it was not at all problematic.

Comparative Example 3

In the process the same as Example 10 except that a high frequency electric power was not applied to one of the substrates provided in the load chamber 301 in the oxygen treatment chamber 304, a reflecting layer and a transparent conductive layer were formed. That is, the oxygen ion contacting operation was not conducted. The reflectance of the substrate having the formed reflecting layer and transparent conductive layer was measured with a spectrophotometer. A 57% reflectance was shown as the oscillation central value with respect to a 800 nm interference. As in Example 10, the film formation process after the semiconductor layer was conducted to obtain a photoelectric conversion element. By the characteristic evaluation of the obtained photoelectric conversion element under the light radiation of AM1.5 (100 mW/cm$^2$), the photoelectric conversion efficiency was 8.4%. It was found that the photoelectric conversion element has a lower reflectance and a lower photoelectric conversion efficiency with respect to the sample of Example 10. It is believed that a light beam was absorbed by the crystal grain boundary of the aluminum film.

Since an incident light beam can be utilized effectively by using a reflecting layer and a transparent conductive layer produced by the present invention, the light absorption to the semiconductor can be increased to provide a high conversion efficiency and thus a photoelectric conversion element can be utilized in a smaller area. Further, continuous production of a photoelectric conversion element can be enabled to contribute to the propagation of an inexpensive and highly reliable photoelectric conversion element for system power.

What is claimed is:

1. A production method for a deposit film by successively laminating a reflecting layer and a transparent conductive layer on a substrate, wherein a step of forming the reflecting layer on the substrate, a step of contacting the formed reflecting layer with active oxygen and/or oxygen ion, and a step of forming the transparent conductive layer on the reflecting layer are conducted continuously in a series of a vacuum film forming space.

2. A production method for a deposit film by successively laminating a reflecting layer and a transparent conductive layer on a substrate, wherein a step of forming a layer made from aluminum or a material containing aluminum on the substrate by a sputtering, a step of contacting the formed reflecting layer with active oxygen and/or oxygen ion, a step of forming a layer mainly containing zinc oxide as the transparent conductive layer on the formed layer by a sputtering method are conducted continuously in a series of a vacuum film forming space, with the oxygen gas introduction from the space for contacting with the active oxygen and/or the oxygen ion to the reflecting layer film forming space limited to 10% or less with respect to the gas partial pressure.

3. The production method for a deposit film according to claim 2, wherein the step of contacting the reflecting layer with the active oxygen and/or the oxygen ion is conducted by using either or both of a target mainly including aluminum or a material containing aluminum and a target mainly including zinc oxide as a cathode electrode, and by passing the substrate having the formed reflecting layer through a space for generating a glow discharge in an atmosphere containing an oxygen gas.

4. A production method for a deposit film comprising: a step of forming a reflecting layer on a substrate by opening a film forming chamber to the atmosphere, reducing the pressure of the film forming chamber, heating the film forming chamber to a temperature higher than a predetermined film forming temperature followed by cooling or self-cooling, and setting the film forming chamber at the predetermined film forming temperature, a step of contacting the reflecting layer surface with active oxygen and/or oxygen ion, and a step of forming a transparent conductive layer.

5. The production method for a deposit film according to claim 4, wherein the film forming chamber comprises a plurality of film forming chambers provided to form a single vacuum vessel.

6. The production method for a deposit film according to claim 4, wherein the temperature for heating the film forming chamber before the reflecting layer formation is in the range from 400° C. to 500° C., and the heating time is in the range of 15 minutes to 120 minutes.

7. The production method for a deposit film according to claim 4, wherein the heating operation followed by cooling or self-cooling is conducted for a plurality of times.

8. The production method for a deposit film according to claim 4, wherein the reflecting layer and/or the transparent conductive layer are formed by a sputtering method, a vacuum deposition method, a chemical gas phase growth method, an ion plating method, or an ion beam method.

9. The production method for a deposit film according to claim 4, wherein the oxygen gas introduction from the space for contacting with the active oxygen and/or the oxygen ion to the reflecting layer film forming chamber is limited to 10% or less with respect to the gas partial pressure.

10. The production method for a deposit film according to claim 4, wherein a device comprising a gas gate or a pinch valve is used between the space for contacting with the active oxygen and/or the oxygen ion to the reflecting layer film forming chamber.

11. The production method for a deposit film according to claim 4, wherein the film formation is conducted while conveying the substrate continuously.

12. The production method for a deposit film according to claim 4, wherein the substrate conveyance is stopped during the film formation, and the substrate is conveyed after the film formation so that the film formation is conducted in the following film forming chamber.

13. The production method for a deposit film according to claim 4, wherein the reflecting layer comprises one selected from the group consisting of Al, Ag, and Cu.

14. The production method for a deposit film according to claim 4, wherein the transparent conductive layer comprises an oxide of at least one selected from the group consisting of Zn, Ti, In, and Sn.

15. The production method for a deposit film according to claim 4, wherein the transparent conductive layer comprises a first transparent conductive layer and a second transparent conductive layer formed in a temperature higher than the film forming temperature for the first transparent conductive layer.

16. A production method for a deposit film comprising a step of forming reflecting layer on a longitudinal substrate by opening a film forming chamber to the atmosphere, setting the longitudinal substrate from a substrate feeding chamber through a plurality of film forming chambers so as to be wound at a substrate winding chamber, reducing the pressure in the film forming chambers, heating the film forming chambers to a temperature higher than a predetermined film forming temperature, and setting the film forming chambers at the predetermined film forming temperature, a step of contacting the reflecting layer surface with active oxygen and/or oxygen ion, and a step of forming a transparent conductive layer.

17. The production method for a deposit film according to claim 16, wherein the temperature for heating the film forming chamber before the reflecting layer formation is in the range from 400° C. to 500° C., and the heating time is in the range of 15 minutes to 120 minutes.

18. The production method for a deposit film according to claim 16, wherein the heating operation followed by cooling or self-cooling is conducted for a plurality of times.

19. The production method for a deposit film according to claim 16, wherein the reflecting layer and/or the transparent conductive layer are formed by a sputtering method, a vacuum deposition method, a chemical gas phase growth method, an ion plating method, or an ion beam method.

20. The production method for a deposit film according to claim 16, wherein the oxygen gas introduction from the space for contacting with the active oxygen and/or the oxygen ion to the reflecting layer film forming chamber is limited to 10% or less with respect to the gas partial pressure.

21. The production method for a deposit film according to claim 16, wherein a device comprising a gas gate or a pinch valve is used between the space for contacting with the active oxygen and/or the oxygen ion to the reflecting layer film forming chamber.

22. The production method for a deposit film according to claim 16, wherein the film formation is conducted while conveying the substrate continuously.

23. The production method for a deposit film according to claim 16, wherein the substrate conveyance is stopped during the film formation, and the substrate is conveyed after the film formation so that the film formation is conducted in the following film forming chamber.

24. The production method for a deposit film according to claim 16, wherein the reflecting layer comprises one selected from the group consisting of Al, Ag, and Cu.

25. The production method for a deposit film according to claim 16, wherein the transparent conductive layer comprises an oxide of at least one selected from the group consisting of Zn, Ti, In, and Sn.

26. The production method for a deposit film according to claim 16, wherein the transparent conductive layer comprises a first transparent conductive layer and a second transparent conductive layer formed in a temperature higher than the film forming temperature for the first transparent conductive layer.

27. A production method for a photoelectric conversion element by successively laminating a reflecting layer and a transparent conductive layer on a substrate, wherein a step of forming the reflecting layer on the substrate, a step of contacting the formed reflecting layer with active oxygen and/or oxygen ion, and a step of forming the transparent conductive layer on the reflecting layer are conducted continuously in a series of a vacuum film forming space.

28. A production method for a photoelectric conversion element by successively laminating a reflecting layer and a transparent conductive layer on a substrate, wherein a step of forming a layer made from aluminum or a material containing aluminum on the substrate by a sputtering, a step of contacting the formed reflecting layer with active oxygen and/or oxygen ion, a step of forming a layer mainly containing zinc oxide as the transparent conductive layer on the formed layer by a sputtering method are conducted continuously in a series of a vacuum film forming space, with the oxygen gas introduction from the space for contacting with the active oxygen and/or the oxygen ion to the reflecting layer film forming space limited to 10% or less with respect to the gas partial pressure.

29. The production method for a photoelectric conversion element according to claim 28, wherein the step of contacting the reflecting layer with the active oxygen and/or the oxygen ion is conducted by using either or both of a target mainly including aluminum or a material containing aluminum and a target mainly including zinc oxide as a cathode electrode, and by passing the substrate having the formed reflecting layer through a space for generating a glow discharge in an atmosphere containing an oxygen gas.

30. A production method for a photoelectric conversion element by successively laminating a reflecting layer, a transparent conductive layer, and a semiconductor layer on a substrate comprising: a step of forming a reflecting layer on a substrate by opening a film forming chamber to the atmosphere, reducing the pressure of the film forming chamber, heating the film forming chamber to a temperature higher than a predetermined film forming temperature followed by cooling or self-cooling, and setting the film forming chamber at the predetermined film forming temperature, a step of contacting the reflecting layer surface with active oxygen and/or oxygen ion, and a step of forming a transparent conductive layer.

31. The production method for a photoelectric conversion element according to claim 30, wherein the film forming chamber comprises a plurality of film forming chambers provided to form a single vacuum vessel.

32. The production method for a photoelectric conversion element according to claim 30, wherein the temperature for heating the film forming chamber before the reflecting layer formation is in the range from 400° C. to 500° C., and the heating time is in the range of 15 minutes to 120 minutes.

33. The production method for a photoelectric conversion element according to claim 30, wherein the heating operation followed by cooling or self-cooling is conducted for a plurality of times.

34. The production method for a photoelectric conversion element according to claim 30, wherein the reflecting layer and/or the transparent conductive layer are formed by a sputtering method, a vacuum deposition method, a chemical gas phase growth method, an ion plating method, or an ion beam method.

35. The production method for a photoelectric conversion element according to claim 30, wherein the oxygen gas introduction from the space for contacting with the active oxygen and/or the oxygen ion to the reflecting layer film forming chamber is limited to 10% or less with respect to the gas partial pressure.

36. The production method for a photoelectric conversion element according to claim 30, wherein a device comprising a gas gate or a pinch valve is used between the space for contacting with the active oxygen and/or the oxygen ion to the reflecting layer film forming chamber.

37. The production method for a photoelectric conversion element according to claim 30, wherein the film formation is conducted while conveying the substrate continuously.

38. The production method for a photoelectric conversion element according to claim 30, wherein the substrate conveyance is stopped during the film formation, and the substrate is conveyed after the film formation so that the film formation is conducted in the following film forming chamber.

39. The production method for a photoelectric conversion element according to claim 30, wherein the reflecting layer comprises one selected from the group consisting of Al, Ag, and Cu.

40. The production method for a photoelectric conversion element according to claim 30, wherein the transparent conductive layer comprises an oxide of at least one selected from the group consisting of Zn, Ti, In, and Sn.

41. The production method for a photoelectric conversion element according to claim 30, wherein the transparent conductive layer comprises a first transparent conductive layer and a second transparent conductive layer formed in a temperature higher than the film forming temperature for the first transparent conductive layer.

42. The production method for a photoelectric conversion element according to claim 30, wherein the semiconductor layer is a non-single crystalline semiconductor layer.

43. A production method for a photoelectric conversion element by successively laminating a reflecting layer, a transparent conductive layer, and a semiconductor layer on a substrate comprising: a step of forming reflecting layer on a longitudinal substrate by opening a film forming chamber to the atmosphere, setting the longitudinal substrate from a substrate feeding chamber through a plurality of film forming chambers so as to be wound at a substrate winding chamber, reducing the pressure in the film forming chambers, heating the film forming chambers to a temperature higher than a predetermined film forming temperature, and setting the film forming chambers at the predetermined film forming temperature, a step of contacting the reflecting layer surface with active oxygen and/or oxygen ion, and a step of forming a transparent conductive layer.

44. The production method for a photoelectric conversion element according to claim 43, wherein the temperature for heating the film forming chamber before the reflecting layer formation is in the range from 400° C. to 500° C., and the heating time is in the range of 15 minutes to 120 minutes.

45. The production method for a photoelectric conversion element according to claim 43, wherein the heating operation followed by cooling or self-cooling is conducted for a plurality of times.

46. The production method for a photoelectric conversion element according to claim 43, wherein the reflecting layer and/or the transparent conductive layer are formed by a sputtering method, a vacuum deposition method, a chemical gas phase growth method, an ion plating method, or an ion beam method.

47. The production method for a photoelectric conversion element according to claim 43, wherein the oxygen gas introduction from the space for contacting with the active oxygen and/or the oxygen ion to the reflecting layer film forming chamber is limited to 10% or less with respect to the gas partial pressure.

48. The production method for a photoelectric conversion element according to claim 43, wherein a device comprising a gas gate or a pinch valve is used between the space for contacting with the active oxygen and/or the oxygen ion to the reflecting layer film forming chamber.

49. The production method for a photoelectric conversion element according to claim 43, wherein the film formation is conducted while conveying the substrate continuously.

50. The production method for a photoelectric conversion element according to claim 43, wherein the substrate conveyance is stopped during the film formation, and the substrate is conveyed after the film formation so that the film formation is conducted in the following film forming chamber.

51. The production method for a photoelectric conversion element according to claim 43, wherein the reflecting layer comprises one selected from the group consisting of Al, Ag, and Cu.

52. The production method for a photoelectric conversion element according to claim 43, wherein the transparent conductive layer comprises an oxide of at least one selected from the group consisting of Zn, Ti, In, and Sn.

53. The production method for a photoelectric conversion element according to claim 43, wherein the transparent conductive layer comprises a first transparent conductive layer and a second transparent conductive layer formed in a temperature higher than the film forming temperature for the first transparent conductive layer.

54. The production method for a photoelectric conversion element according to claim 43, wherein the semiconductor layer is a non-single crystalline semiconductor layer.

55. A production apparatus for a deposit film where a reflecting layer and a transparent conductive layer are successively laminated on a substrate, comprising a means for forming a reflecting layer made from aluminum or a material containing aluminum on a substrate by sputtering, a means for conducting glow discharge in an atmosphere containing an oxygen gas with either or both of a target mainly including aluminum or a material containing aluminum and a target mainly including zinc oxide provided as a cathode electrode, a means for passing the formed reflecting layer through the glow means, a means for limiting the introduction of an oxygen gas to the reflecting layer forming means while allowing the passage of the substrate, provided between the reflecting layer forming means and the glow discharge conducting means, and a means for forming a transparent conductive layer mainly including zinc oxide by sputtering.

56. A production apparatus for a photoelectric conversion element where a reflecting layer and a transparent conductive layer are successively laminated on a substrate, comprising a means for forming a reflecting layer made from aluminum or a material containing aluminum on a substrate by sputtering, a means for conducting glow discharge in an atmosphere containing an oxygen gas with either or both of a target mainly including aluminum or a material containing aluminum and a target mainly including zinc oxide provided as a cathode electrode, a means for passing the formed reflecting layer through the glow means, a means for limiting the introduction of an oxygen gas to the reflecting layer forming means while allowing the passage of the substrate, provided between the reflecting layer forming means and the glow discharge conducting means, and a means for forming a transparent conductive layer mainly including zinc oxide sputtering.

* * * * *

UNITED STATES PATENT AND TRADEMARK OFFICE
CERTIFICATE OF CORRECTION

PATENT NO. : 5,998,730
DATED : December 7, 1999
INVENTOR(S) : Atsushi Shiozaki et al.

It is certified that error appears in the above-identified patent and that said Letters Patent is hereby corrected as shown below:

Title Page:
Item [56] References Cited:
FOREIGN PATENT DOCUMENTS,
"2297737" should read --2-297737--
5171434           5-171434
6116722           6-116722
6116723           6-116723

Column 1:
Line 54, "a technology of" should be deleted.

Column 2:
Line 42, "need" should read --needs-- and "have a" should read --have--.

Column 3:
Line 16, "yet" should be deleted;
Line 51, "material," should read --material;--.

Column 4:
Line 28, "where the" should read --where there is good--.

Column 7:
Line 11, "needs" should read --need--.

Column 9:
Line 52, "of a" should read --of--.

Column 10:
Line 5, "vacuum" should read --the vacuum-- and "the" should be deleted;
Line 14, "micro-crystal," should read --micro-crystal;--.

UNITED STATES PATENT AND TRADEMARK OFFICE
CERTIFICATE OF CORRECTION

PATENT NO. : 5,998,730
DATED : December 7, 1999
INVENTOR(S) : Atsushi Shiozaki et al.

It is certified that error appears in the above-identified patent and that said Letters Patent is hereby corrected as shown below:

Column 12:
Line 43, "become" should read --became--;
Line 51, "become" should read --became--;
Line 60, "become" should read --became--;

Column 15:
Line 30, "therefore" should read --therefor--.

Column 19:
Line 36, "scam" should read --sccm--.

Signed and Sealed this

Third Day of July, 2001

*Nicholas P. Godici*

*Attest:*

*Attesting Officer*

NICHOLAS P. GODICI
*Acting Director of the United States Patent and Trademark Office*